(12) United States Patent
Lee et al.

(10) Patent No.: US 11,778,860 B2
(45) Date of Patent: Oct. 3, 2023

(54) DISPLAY DEVICE

(71) Applicant: LG Display Co., Ltd., Seoul (KR)

(72) Inventors: Tae-Won Lee, Wonju-si (KR); Jong-Chan Park, Paju-si (KR); Hyun-Chul Um, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/220,523

(22) Filed: Apr. 1, 2021

(65) Prior Publication Data

US 2021/0225976 A1    Jul. 22, 2021

Related U.S. Application Data

(62) Division of application No. 16/533,698, filed on Aug. 6, 2019, now Pat. No. 10,991,782.

(30) Foreign Application Priority Data

Sep. 11, 2018 (KR) .......................... 10-2018-0108411

(51) Int. Cl.
*H01L 27/32* (2006.01)
*H10K 59/121* (2023.01)
*H01L 27/12* (2006.01)
*H10K 10/84* (2023.01)
*H10K 50/84* (2023.01)

(52) U.S. Cl.
CPC ..... *H10K 59/1213* (2023.02); *H01L 27/1214* (2013.01); *H10K 10/84* (2023.02); *H10K 50/84* (2023.02)

(58) Field of Classification Search
CPC ............. H01L 27/3262; H01L 27/1214; H01L 51/105; H01L 51/5237

USPC ........................................................... 257/72
See application file for complete search history.

(56) References Cited

U.S. PATENT DOCUMENTS

| | | | |
|---|---|---|---|
| 9,082,667 B2 | 7/2015 | Youn et al. |
| 9,122,116 B2 | 9/2015 | Fujikawa |
| 9,214,498 B2 | 12/2015 | Yun et al. |
| 9,293,485 B2 | 3/2016 | Youn et al. |
| 2013/0168655 A1 | 7/2013 | Yun et al. |
| 2014/0146257 A1 | 5/2014 | Fujikawa |

(Continued)

FOREIGN PATENT DOCUMENTS

| | | |
|---|---|---|
| CN | 108123062 A | 6/2018 |
| DE | 10 2012 024 538 A1 | 3/2014 |

(Continued)

OTHER PUBLICATIONS

Japan Patent Office, Decision of Refusal, JP Patent Application No. 2019-149225, dated Jan. 7, 2021, ten pages.

(Continued)

*Primary Examiner* — Dzung Tran
(74) *Attorney, Agent, or Firm* — Fenwick & West LLP

(57) ABSTRACT

Disclosed is a display device. The display device includes a substrate having an active area and a non-active area, a thin film transistor arranged on the active area of the substrate, at least two planarization layers arranged on the thin film transistor, signal links arranged on the non-active area of the substrate, and an outer cover layer spaced apart from the at least two planarization layers and configured to overlap upper and side surfaces of the signal links, thus preventing or reducing damage to the signal links.

8 Claims, 9 Drawing Sheets

(56) References Cited

U.S. PATENT DOCUMENTS

| | | | |
|---|---|---|---|
| 2014/0217397 A1* | 8/2014 | Kwak | ........... H01L 27/1218 257/43 |
| 2014/0232956 A1 | 8/2014 | Kwon et al. | |
| 2014/0353670 A1 | 12/2014 | Youn et al. | |
| 2015/0287750 A1 | 10/2015 | Youn et al. | |
| 2016/0190225 A1 | 6/2016 | Kim et al. | |
| 2017/0125505 A1 | 5/2017 | Oh | |
| 2017/0277288 A1 | 9/2017 | Choi et al. | |
| 2017/0287995 A1 | 10/2017 | Kim et al. | |
| 2017/0331058 A1 | 11/2017 | Seo et al. | |
| 2017/0345882 A1 | 11/2017 | Nam et al. | |
| 2018/0033821 A1 | 2/2018 | Kim | |
| 2018/0102502 A1 | 4/2018 | Kim et al. | |
| 2018/0122890 A1 | 5/2018 | Park et al. | |
| 2018/0151838 A1 | 5/2018 | Park et al. | |

FOREIGN PATENT DOCUMENTS

| | | |
|---|---|---|
| EP | 2814074 A1 | 12/2014 |
| EP | 2830095 A2 | 1/2015 |
| EP | 3327786 A1 | 5/2018 |
| GB | 2570795 A | 8/2019 |
| JP | 2000-323715 A | 11/2000 |
| JP | 2014-232300 A | 12/2014 |
| KR | 10-2018-0047607 A | 5/2018 |
| WO | WO 2013/011678 A1 | 1/2013 |

OTHER PUBLICATIONS

Japan Patent Office, Notice of Reasons for Refusal, JP Patent Application No. 2019-149225, dated Sep. 1, 2020, ten pages.

The Intellectual Property Office of the United Kingdom, Combined Search and Examination Report under Sections 17 and 18(3), GB Application No. 1912006.2, dated Feb. 17, 2020, seven pages.

United States Office Action, U.S. Appl. No. 16/533,698, dated Sep. 22, 2020, 16 pages.

China National Intellectual Property Administration, Office Action, CN Patent Application No. 201910789135.3, dated Mar. 1, 2023, 14 pages.

German Patent and Trademark Office, Office Action, DE Patent Application No. 102019120820.3, dated Feb. 20, 2023, 13 pages.

Japan Patent Office, Office Action, JP Patent Application No. 2022-041474, dated May 9, 2023, eight pages.

China National Intellectual Property Office, Notice of Allowance, Chinese Patent Application No. 201910789135.3, dated Jul. 28, 2023, eight pages.

* cited by examiner

DISPLAY DEVICE

CROSS-REFERENCE TO RELATED APPLICATIONS

This application is a divisional of U.S. patent application Ser. No. 16/533,698 filed on Aug. 6, 2019 which claims the benefit of Republic of Korea Patent Application No. 10-2018-0108411, filed on Sep. 11, 2018, each of which is incorporated by reference in its entirety.

BACKGROUND

Field of Technology

The present disclosure relates to a display device, and more particularly, to a display device having high definition and high resolution.

Discussion of the Related Art

Image display devices, which display various pieces of information on a screen, are a core technology in the age of information and communication and have been developed to satisfy thinness, light-weight, portability and high-performance trends. Therefore, an organic light emitting diode (OLED) display, which can reduce weight and volume to make up for drawbacks of a cathode ray tube (CRT), is now in the spotlight. Such an organic light emitting diode display is a self-luminous device and has advantages, such as low power consumption, high response speed, high luminous efficacy, high brightness and wide viewing angle. Such an organic light emitting diode display implements an image through a plurality of subpixels arranged in a matrix. Each of the subpixels includes a light emitting element, and a pixel circuit including a plurality of transistors to independently drive the light emitting element.

As the organic light emitting diode display is developed to have high definition and high resolution, load applied to respective signal lines and respective electrodes is greatly increased and thus resistor-capacitor (RC) delay exerting a negative influence on image quality and driving characteristics is gradually increased. Particularly, signal delay due to RC load between the light emitting element and the transistor occurs and may thus cause difficulty in applying a driving signal to each subpixel.

SUMMARY

Accordingly, the present disclosure is directed to a display device that substantially obviates one or more problems due to limitations and disadvantages of the related art.

An object of the present disclosure is to provide a display device having high definition and high resolution.

Additional advantages, objects, and features of the disclosure will be set forth in part in the description which follows and in part will become apparent to those having ordinary skill in the art upon examination of the following. The objectives and other advantages may be realized and attained by the structure particularly pointed out in the written description and claims hereof as well as the appended drawings.

To achieve these objects and other advantages and in accordance with the purpose of the disclosure, as embodied and broadly described herein, a display device includes a substrate having an active area and a non-active area, a thin film transistor arranged on the active area of the substrate, at least two planarization layers arranged on the thin film transistor, signal links arranged on the non-active area of the substrate, and a first outer cover layer configured to overlap upper and side surfaces of the signal links, thus realizing high definition and high resolution and preventing damage to the signal links and a protective film on the signal links.

In some embodiments, the first outer cover layer is spaced apart from the at least two planarization layers. In some embodiments, the at least two planarization layers include a first and second planarization layer. The first planarization layer is arranged on a protective film and is configured to cover the thin film transistor. The second planarization layer is arranged on the first planarization layer. In some embodiments, the display device includes a pixel connection electrode that is connected to a drain electrode of the thin film transistor and arranged between the first and second planarization layers. In some embodiments, the pixel connection electrode is formed of a material which is a same material as the drain electrode.

In some embodiments, the signal links include a lower link and an upper link. The lower link is formed of a same material as a gate electrode of the thin film transistor and is coplanar with the gate electrode. The upper link is formed of a same material as a source electrode and the drain electrode of the thin film transistor. The upper link is coplanar with the source electrode and the drain electrode and is connected to the lower link. The first outer cover layer is formed of the same material as the first planarization layer and is arranged on the protective film. The protective film is arranged on the upper link. In some embodiments, the display device includes at least one link contact hole in an interlayer insulating film arranged between the source and drain electrodes and the gate electrode. The link contact hole exposes the lower link. The upper link is connected to the lower link through the at least one link contact hole. The first outer cover layer overlaps the at least one link contact hole.

In some embodiments, the display device includes conductive pads, a light emitting element, an encapsulation unit, at least one dam, and a second outer cover layer, conductive pads connected to the signal links. The light emitting element is connected to the thin film transistor. The encapsulation unit is arranged on the light emitting element. The at least one dam is arranged between the conductive pads and the light emitting element. The second outer cover layer is arranged between the at least one dam and the conductive pads. In some embodiments, the encapsulation unit includes first and second inorganic encapsulation layers formed of an inorganic insulating material, and an organic encapsulation layer. In some embodiments, the second outer cover layer is formed on the signal links to have a greater line width than that of the signal links. In some embodiments, the signal links are formed of a same material as a source electrode and the drain electrode of the thin film transistor, and the second outer cover layer is formed of a same material as the pixel connection electrode so as to be in a same layer as the pixel connection electrode. In some embodiments, the display device includes a third outer cover layer that is formed on the second outer cover layer and has a greater line width than that of the second outer cover layer. The third outer cover layer is formed of a same material as the second planarization layer.

In some embodiments, the display device includes high voltage supply lines including first and second high voltage supply lines connected through line contact holes passing through the protective film and the first planarization layer. In some embodiments, the display device includes a pixel connection electrode arranged between the first and second planarization layers. The first high voltage supply line is formed of a same material as source and drain electrodes of the thin film transistor so as to be coplanar with the source and drain electrodes, and the second high voltage supply line is formed of a same material as the pixel connection electrode so as to be coplanar with the pixel connection electrode.

In some embodiments, the first outer cover layer includes a plurality of first outer cover layer portions corresponding to a plurality of signal links in the signal links respectively. In some embodiments, each of the plurality of first outer cover layer portions has a flat upper surface or a stepwise upper surface on the signal links.

In still other embodiments, a display device includes a substrate, a thin film transistor, a conductive pad, a first link, a second link, and first outer cover layer. The substrate has an active area and a non-active area. The thin film transistor is in the active area of the substrate. The conductive pad is in the non-active area of the substrate. The first link is electrically connected to the conductive pad is in the non-active area of the substrate. The second link has a first end electrically connected to an electrode of the thin film transistor in the active area of the substrate and has a second end electrically connected to the first link in the non-active area of the substrate. The first outer cover layer covers a top and one or more sides of a signal link region where the first link and the second link overlap from a plan view of the substrate.

In some embodiments, the first link is in a first layer and the second link is in a second layer on the substrate.

In some embodiments, the display device includes an interlayer insulating film between the first link and the second link. The first link and the second link are electrically connected through a hole in the interlayer insulating film.

In some embodiments, the first link has a first width, the second link has a second width greater than the first width in the signal link region where the first link and the second link overlap, and the first outer cover layer has a third width greater than the second width.

In some embodiments, the first link is formed of a same material and in a same layer as a gate electrode of the thin film transistor and the second link is formed of a same material and in a same layer as a source electrode and a drain electrode of the thin film transistor.

In some embodiments, the display device includes a planarization layer that covers the thin film transistor. The first outer cover layer is formed of a same material as the planarization layer.

In some embodiments, the display device includes a first planarization and a pixel connection electrode. The first planarization layer covers the thin film transistor. The pixel connection electrode is electrically connected to a drain electrode of the thin film transistor through a hole in the first planarization layer. The first outer cover layer is formed of a same material as the pixel connection electrode. In some embodiments, the substrate includes a second planarization layer and a second outer cover layer. The second planarization layer covers the pixel connection electrode and the first planarization layer. The second outer cover layer covers top and side surfaces of the of the first outer cover layer. The second outer cover layer is formed of a same material as the second planarization layer.

In some embodiments, the display device includes a light emitting element, an encapsulation unit, and at least one dam. The light emitting element is in the active area and is connected to the thin film transistor. The encapsulation unit is arranged on the light emitting element. The at least one dam is arranged between the conductive pad and the light emitting element. The second outer cover layer is arranged between the at least one dam and the conductive pad.

It is to be understood that both the foregoing general description and the following detailed description of the present disclosure are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Reference will now be made in detail to the preferred embodiments, examples of which are illustrated in the accompanying drawings.

Figure 1:
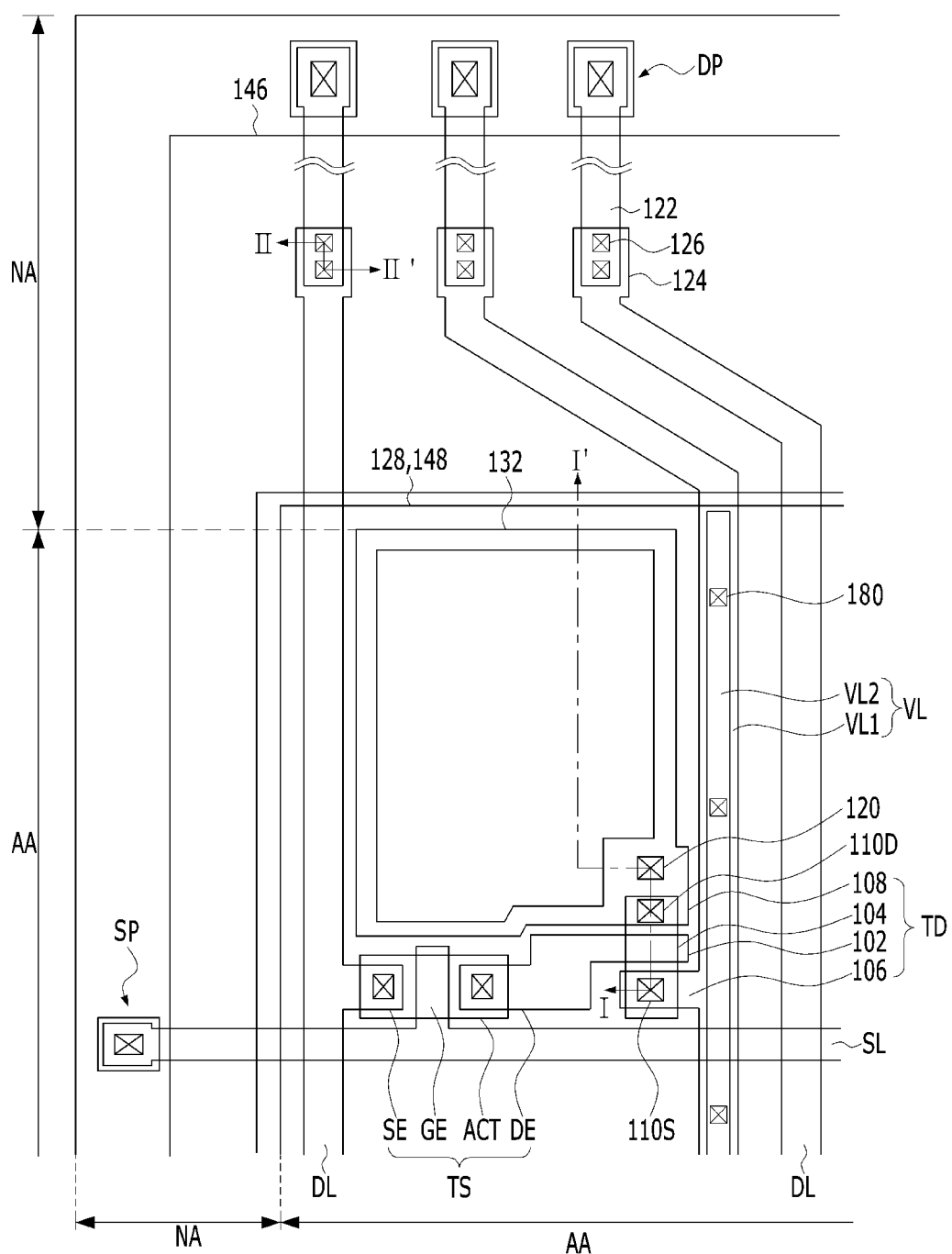
FIG. 1 is a plan view illustrating an organic light emitting diode display in accordance with one embodiment.
Figure 2A:
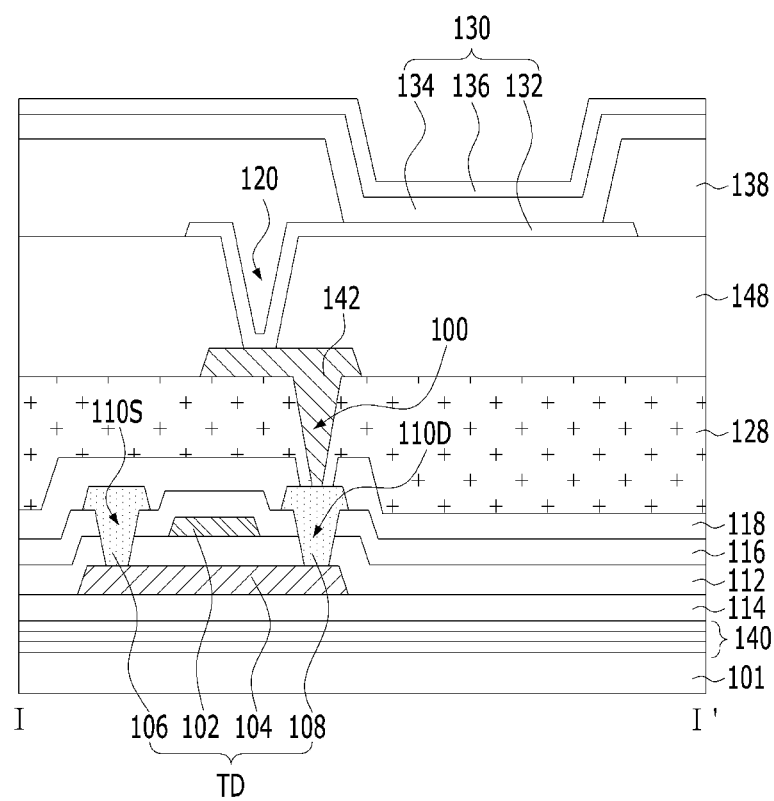
FIGS. 2A and 2B are cross-sectional views illustrating the organic light emitting diode display of FIG. 1, taken along line I-I' and line II-II' in accordance with some embodiments.
Figure 2B:
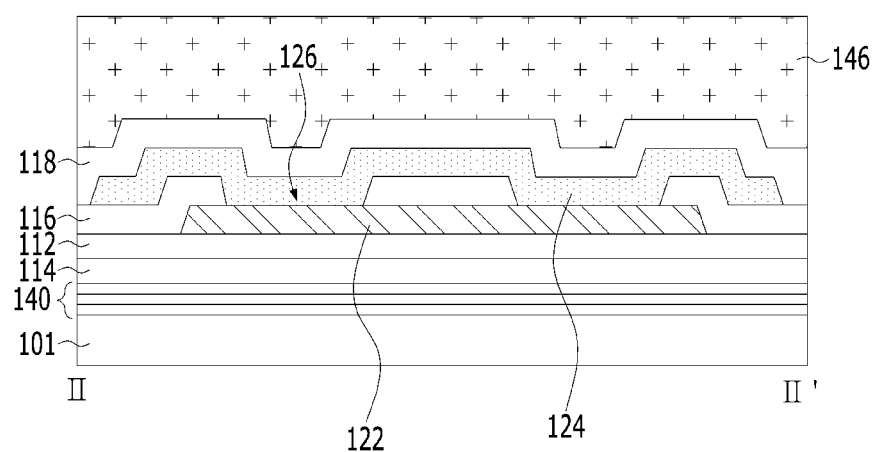

FIG. 1 is a plan view illustrating an organic light emitting diode display in accordance with one embodiment, and FIGS. 2A and 2B are cross-sectional views illustrating the organic light emitting diode display of FIG. 1, taken along line I-I' and line II-II'.

The organic light emitting diode display shown in FIG. 1 and FIGS. 2A and 2B is divided into an active area AA, and a non-active area NA arranged at the perimeter of the active area AA.

A plurality of subpixels is arranged in a matrix in the active area AA to display an image. Each subpixel includes a pixel driving circuit and a light emitting element 130 connected to the pixel driving circuit.

The pixel driving circuit includes a switching transistor TS, a driving transistor TD and a storage capacitor Cst (not shown). The pixel driving circuit having a structure including two transistors TS and TD and one capacitor C is exemplarily described, without being limited thereto.

The switching transistor Ts is turned on when a scan pulse is supplied to s scan line SL, and thus supplies a data signal supplied to a data line DL to the storage capacitor Cst and a gate electrode 102 of the driving transistor TD. For this purpose, the switching transistor TS includes, as exemplarily shown in FIG. 1, a gate electrode GE connected to the scan line SL, a source electrode SE connected to the data line DL, a drain electrode DE connected to the driving transistor TD, and a semiconductor layer ACT forming a channel between the source electrode SE and the drain electrode DE.

The driving transistor TD controls current supplied from high voltage (VDD) supply lines VL to the light emitting element 130 in response to a data signal supplied to the gate electrode 102 of the driving transistor TD, thus adjusting an amount of light emitted from the light emitting element 130. Further, even if the switching transistor TS is turned off, the driving transistor TD supplies constant current by voltage charging the storage capacitor Cst until a data signal of a next frame is supplied and, thus, the light emitting element 130 maintains light emission.

For this purpose, the driving transistor TD includes, as exemplarily shown in FIG. 1 and FIGS. 2A and 2B, a semiconductor layer 104 arranged on an active buffer layer 114, the gate electrode 102 overlapping the semiconductor layer 104 with a gate insulating film 112 disposed therebetween, and source and drain electrodes 106 and 108 formed on an interlayer insulating film 116 and contacting the semiconductor layer 104. In other words, it may be said that overlapping may refer to two elements occupying at least partially the same space in a plan view. It may be said that overlapping does not require direct physical contact between the two elements.

The semiconductor layer 104 is formed of at least one of an amorphous semiconductor material, a polycrystalline semiconductor material or an oxide semiconductor material. The semiconductor layer 104 is formed on the active buffer layer 114. The semiconductor layer 104 includes a channel region, a source region and a drain region. The channel region overlaps the gate electrode 102 with the gate insulating film 112 disposed therebetween and is formed between the source electrode 106 and the drain electrode 108. The source region is conductively connected to the source electrode 106 through a source contact hole 110S passing through the gate insulating film 112 and the interlayer insulating film 116. The drain region is conductively connected to the drain electrode 108 through a drain contact hole 110D passing through the gate insulating film 112 and the interlayer insulating film 116. A multi-buffer layer 140 and the active buffer layer 114 are arranged between the semiconductor layer 104 and a substrate 101. The multi-buffer layer 140 delays diffusion of moisture and/or oxygen permeating the substrate 101. The active buffer layer 114 functions to protect the semiconductor layer 104 and to block various kinds of defects introduced from the substrate 101.

Here, the uppermost layer of the multi-buffer layer 140 contacting the active buffer layer 114 is formed of a material having different etching characteristics from the remaining layers of the multi-buffer layer 140, the active buffer layer 114, the gate insulating film 112 and the interlayer insulating film 116. The uppermost layer of the multi-buffer layer 140 contacting the active buffer layer 114 is formed of one of $SiN_x$ and $SiO_x$, and the remaining layers of the multi-buffer layer 140, the active buffer layer 114, the gate insulating film 112 and the interlayer insulating film 116 are formed of the other of $SiN_x$ and $SiO_x$. For example, the uppermost layer of the multi-buffer layer 140 contacting the active buffer layer 114 is formed of $SiN_x$, and the remaining layers of the multi-buffer layer 140, the active buffer layer 114, the gate insulating film 112 and the interlayer insulating film 116 are formed of $SiO_x$.

The gate electrode 102 is formed on the gate insulating film 112, and overlaps the channel region of the semiconductor layer 104 with the gate insulating film 112 interposed therebetween. The gate electrode 102 is formed of a first conductive material having a single layer or multilayer structure using one selected from the group consisting of molybdenum (Mo), aluminum (Al), chrome (Cr), gold (Au), titanium (Ti), nickel (Ni), neodymium (Nd) and copper (Cu), or an alloy thereof.

The source electrode 106 is connected to the source region of the semiconductor layer 104 exposed through the source contact hole 110S passing through the gate insulting film 112 and the interlayer insulating film 116. The drain electrode 108 is disposed opposite to the source electrode 106 and is connected to the drain region of the semiconductor layer 104 through the drain contact hole 110D passing through the gate insulating film 112 and the interlayer insulating film 116. The source and drain electrodes 106 and 108 are formed of a second conductive material having a single layer or multilayer structure using one selected from the group consisting of molybdenum (Mo), aluminum (Al), chrome (Cr), gold (Au), titanium (Ti), nickel (Ni), neodymium (Nd) and copper (Cu), or an alloy thereof.

A pixel connection electrode 142 is arranged between first and second planarization layers 128 and 148. The pixel connection electrode 142 is exposed through a first pixel contact hole 100 passing through a protective film 118 and the first planarization layer 128, and is connected to the drain electrode 108. The pixel connection electrode 142 is formed of a material having a low specific resistance which is the same as or similar to the drain electrode 108. In other words, it may be said that a material having a low specific resistance refers to a material having a low resistivity. Herein it may be said that, a material having a low specific resistance may be a metal.

The high voltage supply lines VL disposed in parallel with the data line DL include first and second high voltage supply lines VL1 and VL2 connected through line contact holes 180 passing through the protective film 118 and the first planarization layer 128. The first high voltage supply line VL1 is formed of the same material as the source and drain electrodes 106 and 108 of the driving transistor TD so as to be coplanar (e.g., in a same layer) with the source and drain electrodes 106 and 108, and the second high voltage supply line VL2 is formed of the same material as the pixel connection electrode 142 so as to be coplanar with the pixel connection electrode 142. For example, the second high voltage supply line VL2 and the pixel connection electrode 142 are formed of a conductive material having a single layer or multilayer structure using one selected from the group consisting of molybdenum (Mo), aluminum (Al), chrome (Cr), gold (Au), titanium (Ti), nickel (Ni), neodymium (Nd) and copper (Cu), or an alloy thereof. The conductive material may be referred to as the third conductive material herein.

As such, the high voltage supply lines VL of the include the first and second high voltage supply lines VL1 and VL2 which are conductively connected through the line contact holes 180, and thus, resistance of the high voltage supply lines VL may be reduced and an RC time constant may be reduced. Accordingly, delay of transmission of high voltage (VDD) from the high voltage supply lines VL to the source electrode 106 of the driving transistor TD may be prevented and thus high definition and high resolution may be realized.

The light emitting element 130 includes an anode 132, at least one light emitting stack 134 formed on the anode 132, and a cathode 136 formed on the at least one light emitting stack 134.

The anode 132 is conductively connected to the pixel connection electrode 142 exposed through a second pixel contact hole 120 passing through the second planarization layer 148 arranged on the first planarization layer 128.

The anodes 132 of the respective subpixels are formed to be exposed by a bank 138. Such a bank 138 may be formed of an opaque material (for example, a black-colored material) so as to prevent optical coherence between adjacent subpixels. In this case, the bank 138 includes a light-shielding material formed of at least one selected from the group consisting of a color pigment, an organic black pigment and carbon.

The at least one light emitting stack 134 is formed on the anode 132 in a light emitting area prepared by the bank 138. The at least one light emitting stack 134 is formed by stacking a hole-related layer, an organic light emitting layer and an electron-related layer on the anode 132 in regular order or in reverse order. Otherwise, the at least one light emitting stack 134 may include first and second light emitting stacks disposed opposite to each other with a charge generation layer interposed therebetween. In this case, an organic light emitting layer of one of the first and second light emitting stacks generates blue light, an organic light emitting layer of the other of the first and second light emitting stacks generates yellow-green light and, thus, white light is generated through the first and second light emitting stacks. White light generated by the at least one light emitting stack 134 is incident upon color filters (not shown) located on or under the at least one light emitting stack 134, thus implementing a color image. Otherwise, without separate color filters, each light emitting stack 134 may generate color light corresponding to each subpixel, thus implementing a color image. That is, the light emitting stack 134 of the red (R) subpixel may generate red light, the light emitting stack 134 of the green (G) subpixel may generate green light, and the light emitting stack 134 of the blue (B) subpixel may generate blue light.

The cathode 136 is formed opposite to the anode 132 with the at least one light emitting stack 134 disposed therebetween and is connected to low voltage (VSS) supply lines.

Data pads DP connected to the data lines DL, scan pads SP connected to the scan lines SL, and power pads (not shown) connected to the low voltage (VSS) supply lines and the high voltage (VDD) supply lines are arranged in the non-active area NA. The data pads DP, the scan pads SP and the power pads may be arranged in the non-active area NA arranged at any one of one side and the other side of the substrate 101, or the data pads DP, the scan pads SP and the power pads may be arranged in the non-active area NA arranged at different regions of the substrate 101. Arrangement of the data pads DP, the scan pads SP and the power pads is not limited to the structure shown in FIG. 1, and may be variously modified according to design specifications of the display.

At least one conductive pad of the data pads DP, the scan pads SP or the power pads is connected to the corresponding signal line through a signal link. The signal link may include a lower link 122 and an upper link 124, as exemplarily shown in FIGS. 1, 2A, and 2B. The signal link may be referred to herein as a "signal link region." The signal link may include a region where the lower link 122 and the upper link 124 overlap from a plan view of the substrate 101.

The lower link 122 extends from one of the conductive pad and the signal line, and the upper link 124 extends from the other of the conductive pad and the signal line.

The lower link 122 is exposed through at least one link contact hole 126 passing through at least one interlayer insulating film 116 arranged between the source and drain electrodes 106 and 108 and the gate electrode 102, and is connected to the upper link 124. The lower link 122 is formed of the same material as the gate electrode 102 of the driving transistor TD so as to be coplanar with the gate electrode 102 (for example, to be arranged on the gate insulating film 112), and the upper link 124 is formed of the same material as the source and drain electrodes 106 and 108 of the driving transistor TD so as to be coplanar with the source and drain electrodes 106 and 108 (for example, to be arranged on the interlayer insulating film 116).

The protective film 118 formed of an inorganic insulating material is arranged on the upper link 124, and an outer cover layer 146 (may be referred to herein as the first outer cover layer) formed of the same organic insulating material as the first planarization layer 128 is arranged on the protective film 118.

The outer cover layer 146 formed of the organic insulating material is formed to be spaced apart from the first and second planarization layers 128 and 148. In other words, it may be said that 'spaced apart from' may refer to an arrangement where the two components are arranged such that they are not in physical contact. Therefore, inflow of moisture or oxygen from the outside into the light emitting element 130 through the outer cover layer 146 and the first and second planarization layers 128 and 148 is prevented, and thus damage to the light emitting element 130 may be prevented.

Figure 3:
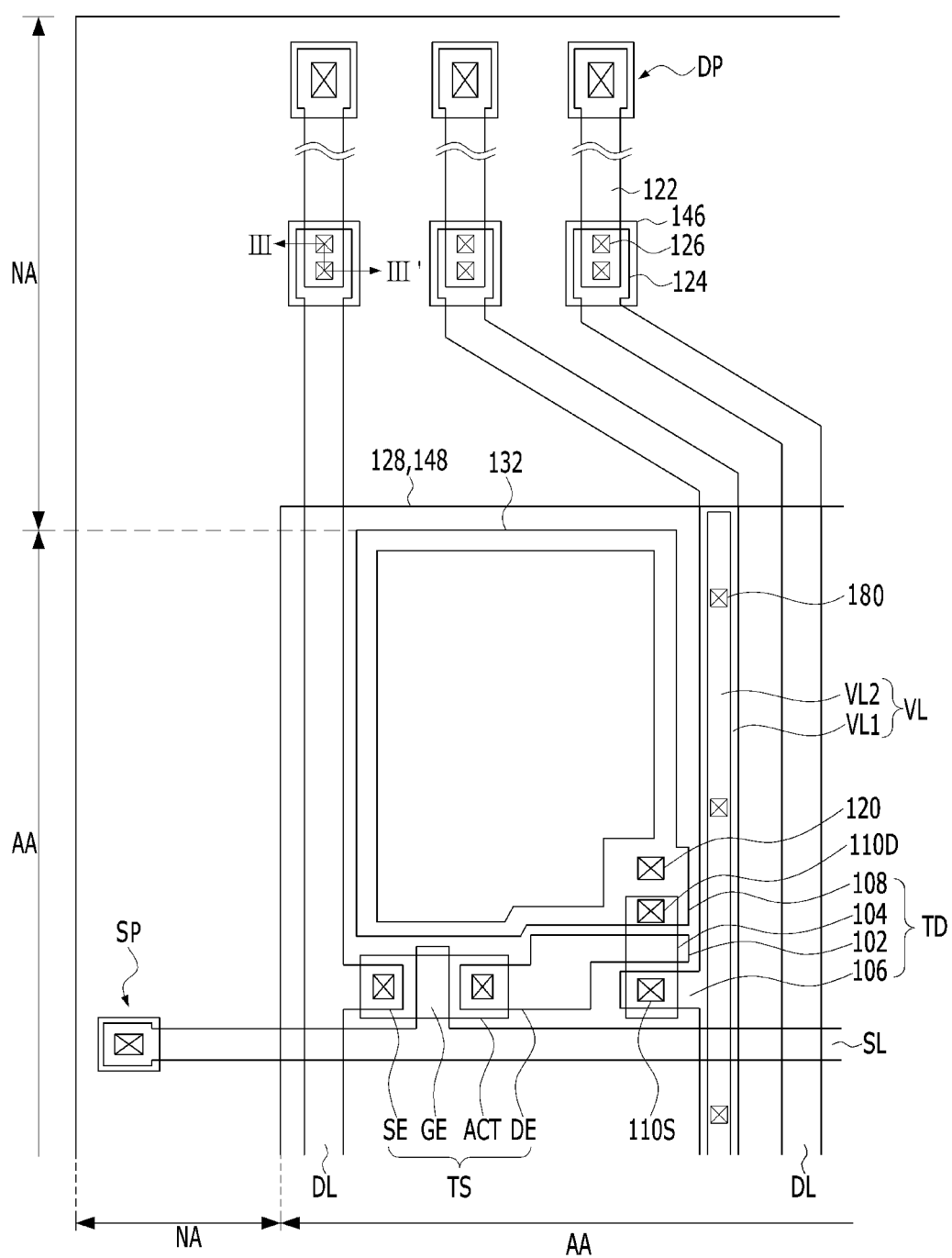
FIG. 3 is a plan view illustrating an organic light emitting diode display having an outer cover layer differing from that of the light emitting diode display shown in FIG. 1 in accordance with one embodiment.
Figure 4A:
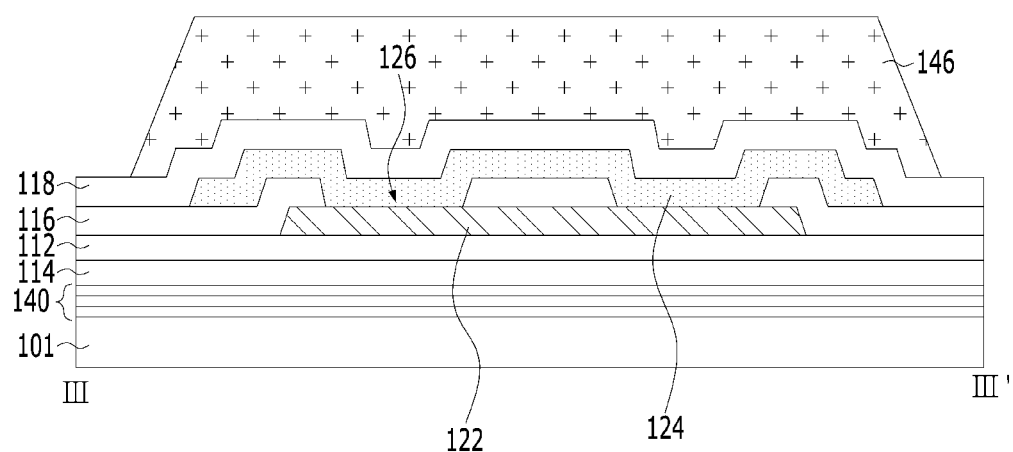
FIGS. 4A and 4B are cross-sectional views illustrating the organic light emitting diode display of FIG. 3, taken along line III-III' in accordance with some embodiments.
Figure 4B:
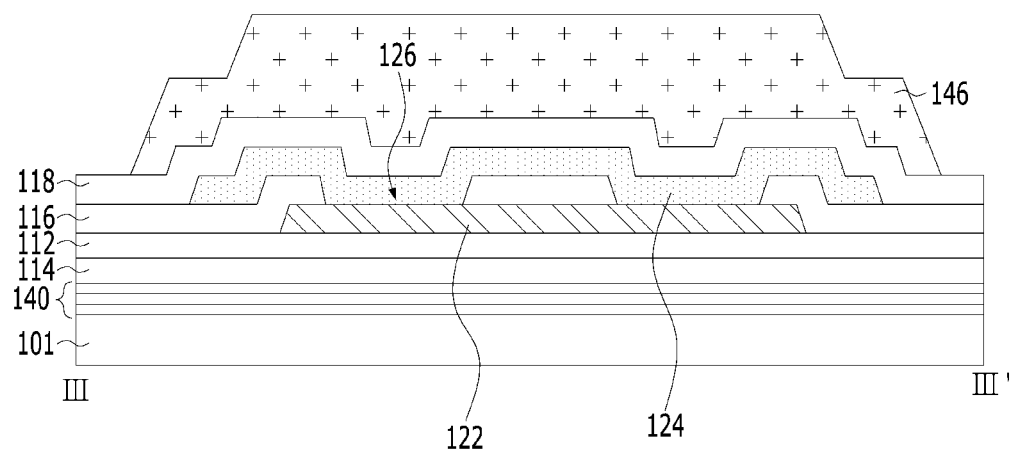

The outer cover layer 146 may be formed to correspond to a plurality of signal links arranged on the substrate 101 one-to-many (in other words, it may be said that one outer cover layer corresponds to more than one signal link), as exemplarily shown in FIG. 1, or be formed to correspond to signal links one-to-one (in other words, it may be said that one outer cover layer corresponds to one signal link), as exemplarily shown in FIG. 3 and FIGS. 4A and 4B. In some embodiments a signal link refers to a conductive path between two components of the display device.

The outer cover layer 146 may be formed to have a flat upper surface on the upper link 124, as exemplarily shown in FIG. 4A, or be formed to have a stepwise upper surface so that the thickness of the outer cover layer 146 is decreased in a direction to the edge thereof, as exemplarily shown in FIG. 4B. The outer cover layer 146 having the stepwise upper surface may prevent a defect of the outer cover layer 146 caused by generation of stepped portions during a subsequent process of the outer cover layer 146.

The outer cover layer 146 is formed to overlap not only the link contact holes 126 but also the upper surface and the side surface of the upper link 124. Particularly, the outer cover layer 146 is formed on the protective film 118 covering stepped portions generated by the link contact holes 126 and stepped portions generated by the side surfaces of the upper links 124 so as to overlap the link contact holes 126.

Therefore, embodiments may prevent loss of the protective film 118 and damage to the upper links 124 during a subsequent process of the first planarization layer 128. This will be described in detail with reference to FIGS. 5A and 5B and FIGS. 6A and 6B.

Figure 5A:
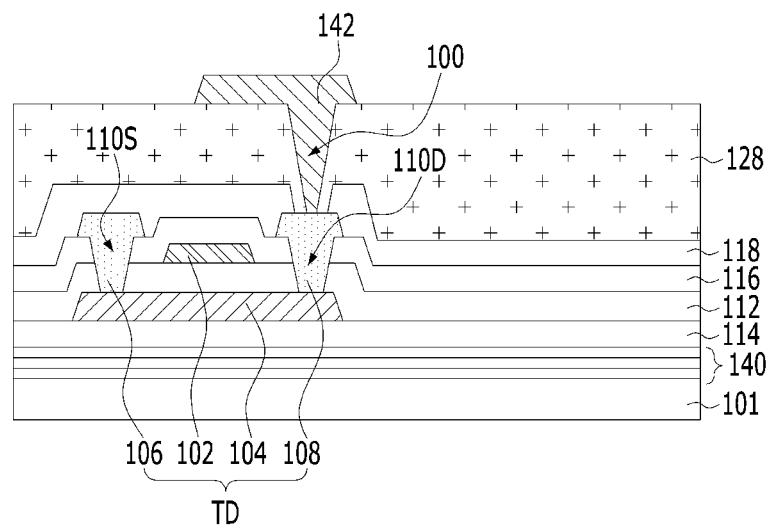
FIGS. 5A and 5B are cross-sectional views illustrating an organic light emitting diode display having no outer cover layer according to a comparative example in accordance with some embodiments.
Figure 5B:
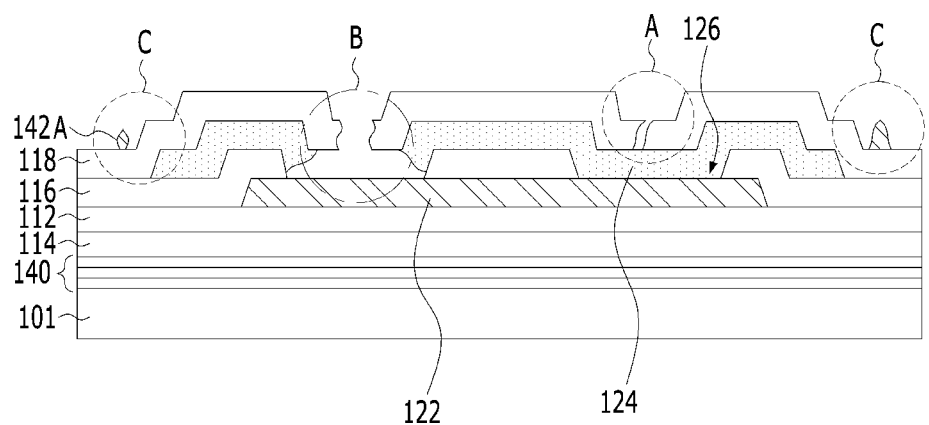
Figure 6A:
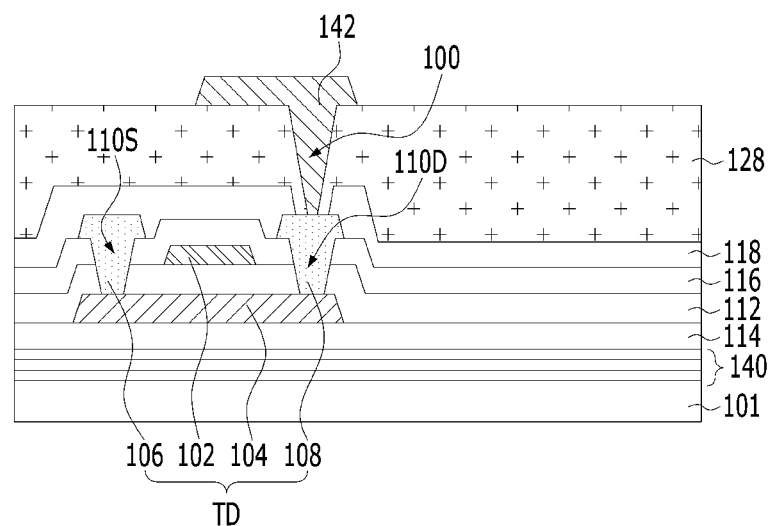
FIGS. 6A and 6B are cross-sectional views illustrating an organic light emitting diode display having an outer cover layer in accordance with some embodiments.
Figure 6B:
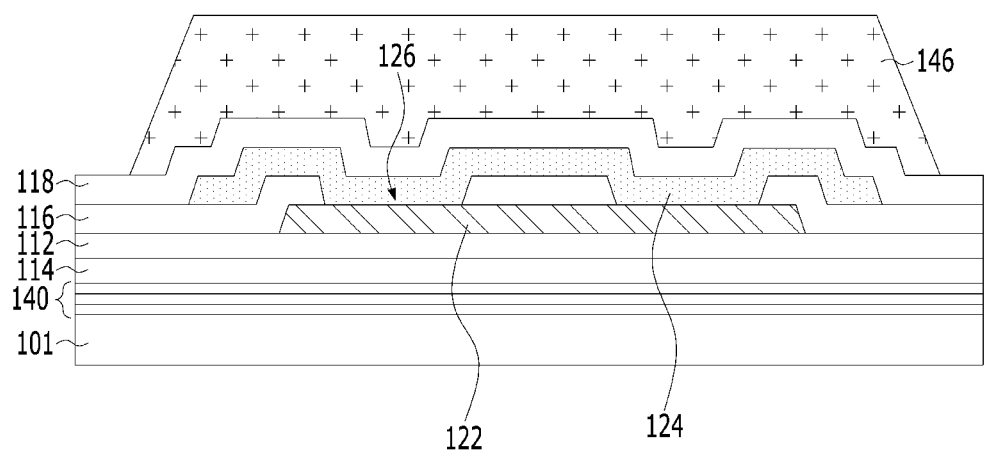

FIGS. 5A and 5B are cross-sectional views illustrating an organic light emitting diode display having no outer cover layer according to a comparative example, and FIGS. 6A and 6B are cross-sectional views illustrating an organic light emitting diode display having an outer cover layer according to an example.

In the comparative example shown in FIGS. 5A and 5B, after lower links 122, an interlayer insulating film 116, upper links 124, a protective film 118 and a first planarization layer 128 are sequentially formed, a pixel connection electrode 142 is formed in an active area. Here, during a dry etching process for forming the pixel connection electrode 142, a portion of the protective film 118 corresponding to a stepped portion generated by a link contact hole 126 can be removed. And, the upper link 124 can be exposed through the removed portion of the protective film 118 (region A). The exposed upper link 124 causes short-circuit with a conductive material of at least one of an anode 132 or a cathode 136 formed after formation of the pixel connection electrode 142.

Further, during a dry etching process for forming at least one of the pixel connection electrode 142 or the anode 132, if the protective film 118 is lost (region B), the upper link 124 under the protective film 118 can be released or damaged. In this case, a contact defect between the lower link 122 and the upper link 124 occurs, and the material released from the upper link 124 can be moved to the active area by a wet etching solution during the etching process of the anode 132. And, a defect of foreign substances can be occurred by the released material moved to the active area.

Moreover, during the dry etching process for forming the pixel connection electrode 142, a tip including a residue material 142A of the pixel connection electrode 142 (region C) may be generated around the upper link 124 (referred to as a tip defect). The residue material 142A of the pixel connection electrode 142 can be moved to the active area by the etching solution during the wet etching process of the anode 132. And a defect of foreign substances can be occurred by the residue material 142A moved to the active area.

In contrast, in the example shown in FIGS. 6A and 6B, after lower links 122, an interlayer insulating film 116, upper links 124 and a protective film 118 are sequentially formed, a first planarization layer 128 and an outer cover layer 146 are simultaneously formed. Thereafter, a pixel connection electrode 142 is formed in an active area. During a dry etching process for forming the pixel connection electrode 142, the outer cover layer 146 covers the protective film 118 on the upper links 124. The outer cover layer 146 covers the protective film 118 at a stepped portion generated by a link contact hole 126 during the dry etching process for forming the pixel connection electrode 142. Therefore, loss of the protective film 118 and exposure of the upper links 124 during the dry etching process for forming the pixel connection electrode 142 may be prevented or reduced. Accordingly, short-circuit between the upper link 124 and a conductive material of at least one of an anode 132 or a cathode 136, a contact defect between the upper link 124 and a lower link 122, and a defect due to foreign substances, caused by a conductive material of at least one of the upper link 124 or the pixel connection electrode 142, may be prevented or reduced.

Figure 7:
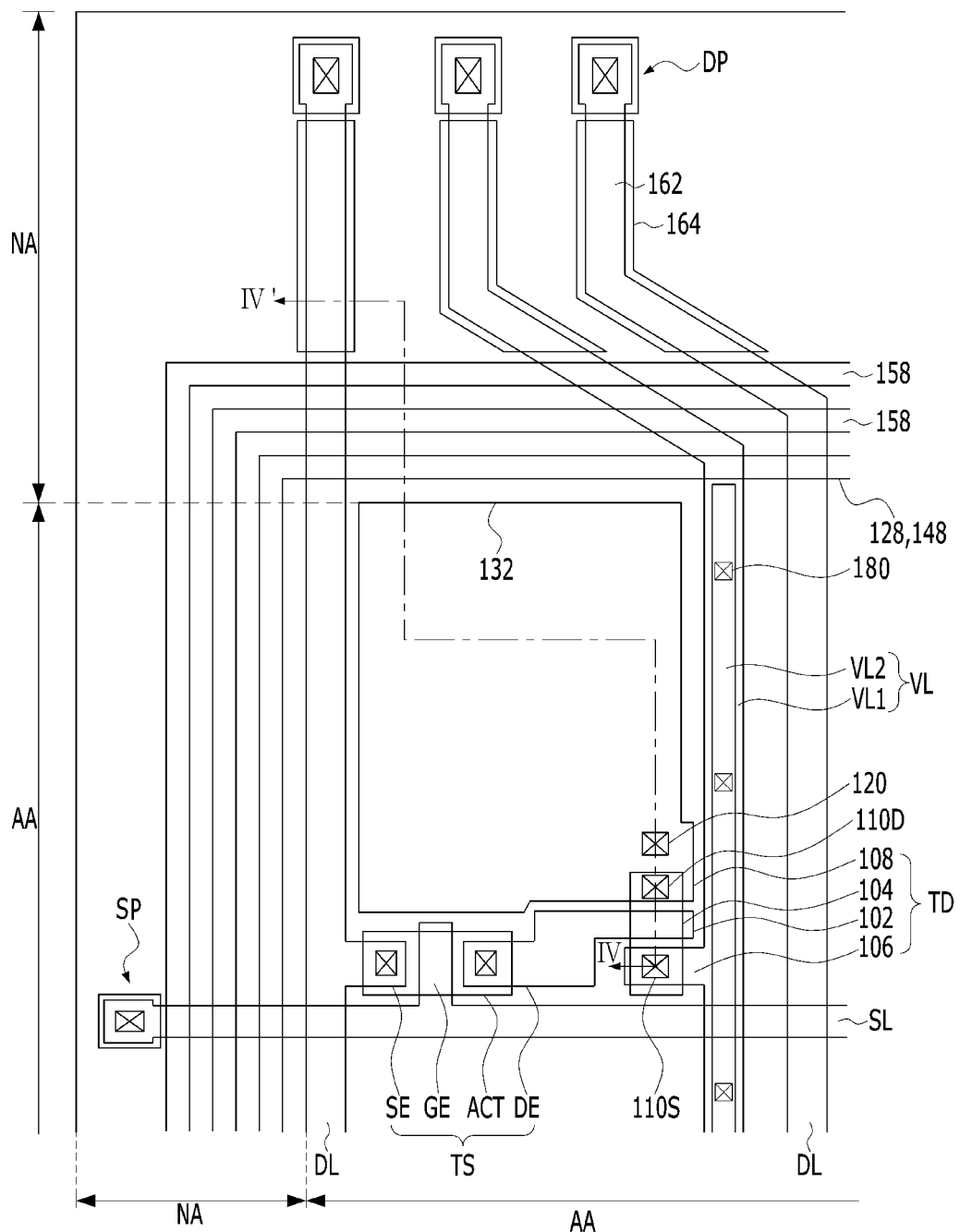
FIG. 7 is a plan view illustrating an organic light emitting diode display in accordance with an embodiment.
Figure 8:
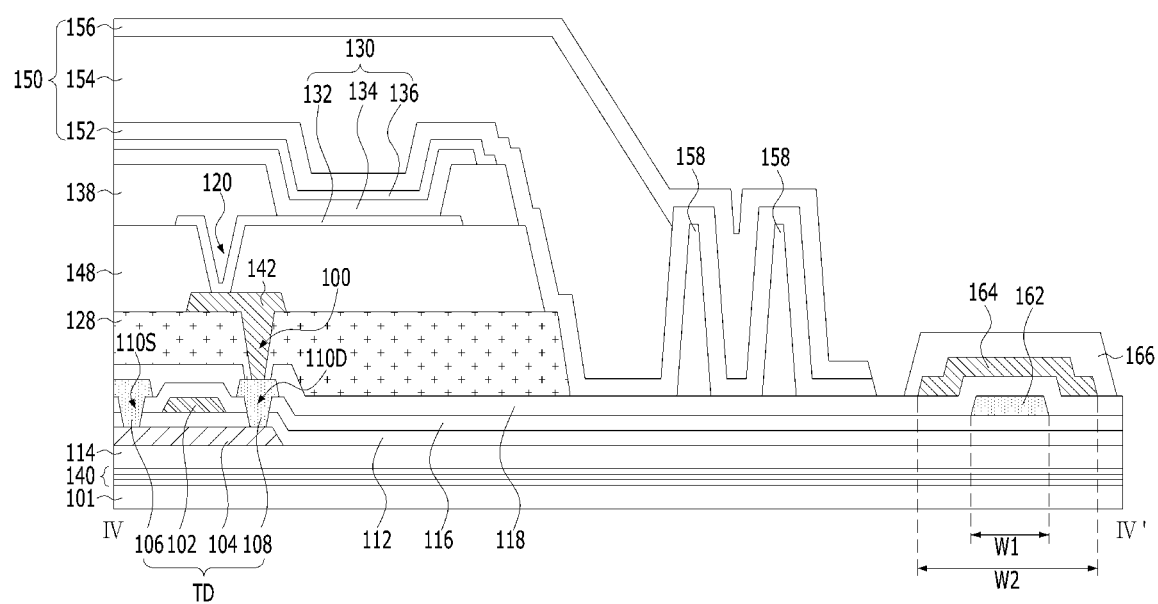
FIG. 8 is a cross-sectional view illustrating the organic light emitting diode display of FIG. 7, taken along line IV-IV' in accordance with an embodiment.

FIG. 7 is a plan view illustrating an organic light emitting diode display in accordance with another embodiment, and FIG. 8 is a cross-sectional view illustrating the organic light emitting diode display of FIG. 7, taken along line IV-IV'.

The display shown in FIGS. 7 and 8 includes the same elements as the display shown in FIGS. 1 and 2 except that the display shown in FIGS. 7 and 8 further includes an encapsulation unit 150, a plurality of dams 158 and a second outer cover layer 164. Therefore, a detail description of the elements of the organic light emitting diode display in accordance with this embodiment, which are the same as those of the organic light emitting diode display in accordance with the former embodiment, will be omitted.

The encapsulation unit 150 prevents or reduces external moisture or oxygen from permeating the light emitting elements 130, which are vulnerable to external moisture or oxygen. For this purpose, the encapsulation unit 150 includes at least one inorganic encapsulation layer and at least one organic encapsulation layer. In some embodiments, the encapsulation unit 150 having a structure in which a first inorganic encapsulation layer 152, an organic encapsulation layer 154 and a second inorganic encapsulation layer 156 are sequentially stacked will be exemplarily described.

The first inorganic encapsulation layer 152 is formed on a substrate 101 provided with a cathode 136 formed thereon. The second inorganic encapsulation layer 156 is formed on the substrate 101 provided with the organic encapsulation layer 154 formed thereon, and the first inorganic encapsulation layer 152 and the second inorganic encapsulation layer 156 are formed to surround the upper, lower and side surfaces of the organic encapsulation layer 154. The first and second inorganic encapsulation layers 152 and 156 minimize or block permeation of external moisture or oxygen into a light emitting stack 134. The first and second inorganic encapsulation layers 152 and 156 are formed of an inorganic insulating material which may be deposited at a low temperature, such as silicon nitride ($SiN_x$), silicon oxide ($SiO_x$), silicon oxynitride (SiON) or aluminum oxide ($Al_2O_3$). Therefore, since the first and second inorganic encapsulation layers 152 and 156 are deposited in a low-temperature atmosphere, damage to the light emitting stack 134, which is vulnerable to a high-temperature atmosphere, during a deposition process of the first and second inorganic encapsulation layers 152 and 156 may be prevented or reduced.

The organic encapsulation layer 154 serves as a buffer to damp stress between respective layers according to bending of the organic light emitting diode display, and strengthens planarization performance of the organic light emitting diode display. The organic encapsulation layer 154 is formed of a non-photosensitive organic insulating material, such as polycaprolactone (PCL), acrylic resin, epoxy resin, polyimide, polyethylene or silicon oxycarbide (SiOC), or a photosensitive organic insulating material, such as photoacryl, on the substrate 101 provided with the first inorganic encapsulation layer 152 formed thereon. If the organic encapsulation layer 154 is formed through an inkjet method, the dams 158 are arranged so as to prevent or reduce the organic encapsulation layer 154 in a liquid state from diffusing into the edge of the substrate 101. The dams 158 are arranged more closely to the edge of the substrate 101 than the organic encapsulation layer 154. The dams 158 may prevent or reduce the organic encapsulation layer 154 from diffusing to a pad region in which conductive pads arranged in the outermost region of the substrate 101 are arranged.

The second outer cover layer 164 may be arranged in a region which may not be covered by the outer cover layer 146 shown in FIGS. 1 and 2. For example, the second outer cover layer 164 is arranged in a region between the dams 158 and the conductive pads SP and DP, in which a thin film formed of an organic insulating material (e.g., usable as a moving path of external moisture or oxygen) may not be arranged. In some embodiments, the second outer cover layer 164 is formed instead of the outer cover layer 146. In other embodiments, the second outer cover layer 164 is formed in addition to the outer cover layer 146.

The second outer cover layer 164 is formed through the same mask process as the pixel connection electrode 142. That is, the second outer cover layer 164 may be formed of the third conductive material (e.g., the same material as the pixel connection electrode 142) on the protective film 118 so as to be coplanar with the pixel connection electrode 142. The second outer cover layer 164 is arranged on signal links 162 formed of a second conductive material (e.g., the same material as source and drain electrodes 106 and 108). The signal links 162 may be a single line that electrically connects a conductive pad (e.g., a data pad) to a corresponding signal line. The second outer cover layer 164 has a line width w2 that is greater than a line width w1 of the signal links 162. Because the second outer cover layer 164 has a wider line width than the signal links 162, the second outer cover layer 164 covers the upper and side surfaces of the signal links 162. Since the protective film 118 may be arranged over the signal links 162, the second outer cover layer 164 may also be arranged over the protective film 118. Accordingly, during an etching process for forming the second outer cover layer 164 and the pixel connection electrode 142, the third conductive material of the second outer cover layer 164 covers the protective film 118 on the signal links 162. Therefore, embodiments may prevent or reduce the loss of the protective film 118 arranged on the signal links 162, damage to the signal links 162, and tip defects of the third conductive material.

A third outer cover layer 166 formed of the same material as a second planarization layer 148 is arranged on the second outer cover layer 164. The third outer cover layer 166 has a greater line width than the line width w2 of the second outer cover layer 164 so as to cover the side and upper surfaces of the second outer cover layer 164. Such a third outer cover layer 166 is formed to have a thickness less than that of the second planarization layer 148, and thus, generation of stepped portions due to the third outer cover layer 166 may be reduced. Accordingly, during a process of pressing a signal transmission film (for example, a flexible printed circuit (FPC) or a tape carrier package (TCP)) to the conductive pads adjacent to the third outer cover layer 166, a pressing process defect due to a thickness of the third outer cover layer 166 may be prevented or reduced.

Although the former embodiment exemplarily describes the structure including the outer cover layer 146 and the latter embodiment exemplarily describes the structure including the second and third cover layers 164 and 166, yet another embodiment may describe a structure including both the outer cover layer 146 and the second and third cover layers 164 and 166.

Further, the present disclosure exemplarily describes the structure, in which the outer cover layer 146 is arranged on the signal links 122 and 124 having the link contact holes 126, and the second and third outer cover layers 164 and 166 are arranged on the signal links 162 having no link contact holes 126, but the disclosure is not limited thereto. The second and third outer cover layers 164 and 166 may be arranged on the signal links 122 and 124 having the link contact holes 126, and the outer cover layer 146 may be arranged on the signal links 162 having no link contact holes 126.

Also, although the present disclosure exemplarily describes the structure in which the outer cover layer 146 and the second and third outer cover layers 164 and 166 are arranged on the signal links 122, 124 and 162 connected to the data pads DP, the outer cover layer 146 and the second and third outer cover layers 164 and 166 may be arranged on signal links connected to the scan pads SP and/or the power pads.

Moreover, although the present disclosure exemplarily describes the organic light emitting diode display, the disclosure may be applied to all display devices including thin film transistors.

As apparent from the above description, in a display device in accordance with the present disclosure, a drain electrode of a thin film transistor is connected to an anode of a light emitting element through a pixel connection electrode formed of a material having a low specific resistance. Therefore, the display device in accordance with the present disclosure may reduce signal delay due to RC load between the light emitting element and the thin film transistor and thus realize high definition and high resolution.

Further, the display device in accordance with the present disclosure includes an outer cover layer overlapping a stepped portion generated by the side surface of a signal link and a stepped portion generated by a link contact hole interconnecting the signal links. Therefore, the display device in accordance with the present disclosure may prevent or reduce the loss of a protective film covering the signal links, release of the signal links, and tip defects of the third conductive material during an etching process for forming the pixel connection electrode.

It will be apparent to those skilled in the art that various modifications and variations can be made in the present disclosure without departing from the spirit or scope of the invention. Thus, it is intended that the present disclosure cover the modifications and variations provided they come within the scope of the appended claims and their equivalents.

What is claimed is:

1. A display device comprising:
   a substrate having an active area and a non-active area;
   a thin film transistor in the active area of the substrate;
   a first planarization layer that covers the thin film transistor;
   a conductive pad in the non-active area of the substrate;
   a first link electrically connected to the conductive pad in the non-active area of the substrate;
   a second link having a first end electrically connected to an electrode of the thin film transistor in the active area of the substrate and a second end electrically connected to the first link in the non-active area of the substrate; and
   a first outer cover layer covering a top and one or more sides of a signal link region where the first link and the second link overlap from a plan view of the substrate,
   wherein the first outer cover layer comprises a same material as the first planarization layer,
   wherein the first outer cover layer is spaced apart from the first planarization layer, and
   wherein the first outer cover layer fully covers the first link and the second link in the signal link region.

2. The display device of claim 1, wherein the first link is in a first layer and the second link is in a second layer on the first layer.

3. The display device of claim 1, further comprising an interlayer insulating film between the first link and the second link, wherein the first link and the second link are electrically connected through a hole in the interlayer insulating film.

4. The display device of claim 1, wherein:
   the first link has a first width, the second link has a second width greater than the first width in the signal link region where the first link and the second link overlap, and the first outer cover layer has a third width greater than the second width.

5. The display device of claim 1, wherein:

the first link is formed of a same material and in a same layer as a gate electrode of the thin film transistor, and the second link is formed of a same material and in a same layer as a source electrode and a drain electrode of the thin film transistor.

6. The display device of claim 1, further comprising:

a pixel connection electrode that is electrically connected to a drain electrode of the thin film transistor through a hole in the first planarization layer.

7. The display device of claim 6, wherein the substrate includes:

a second planarization layer that covers the pixel connection electrode and the first planarization layer; and a second outer cover layer that covers top and side surfaces of the first outer cover layer, wherein the second outer cover layer is formed of a same material as the second planarization layer.

8. The display device of claim 1, further comprising:

a light emitting element in the active area and connected to the thin film transistor;

an encapsulation unit arranged on the light emitting element;

at least one dam arranged between the conductive pad and the light emitting element; and a second outer cover layer arranged between the at least one dam and the conductive pad.

* * * * *